United States Patent [19]

Pozzi

[11] 4,396,912
[45] Aug. 2, 1983

[54] METHOD AND MEANS FOR POINT CONNECTING WITH A DIFFERENTIAL INTEGRATOR DOT CONNECTOR CIRCUIT

[75] Inventor: Michael A. Pozzi, Colorado Springs, Colo.

[73] Assignee: Hewlett-Packard Company, Palo Alto, Calif.

[21] Appl. No.: 293,711

[22] Filed: Aug. 17, 1981

[51] Int. Cl.³ .............................................. G09G 1/12
[52] U.S. Cl. .................................... 340/728; 315/367; 328/135; 340/739
[58] Field of Search ................ 340/728, 739; 328/135; 315/367

[56] References Cited

U.S. PATENT DOCUMENTS

| | | | |
|---|---|---|---|
| 3,824,382 | 7/1974 | Eshelman | 340/739 X |
| 4,160,175 | 7/1979 | Trout | 328/135 X |
| 4,359,728 | 11/1982 | Mahony | 340/728 X |

*Primary Examiner*—David L. Trafton
*Attorney, Agent, or Firm*—Jeffery B. Fromm; Edward Y. Wong

[57] ABSTRACT

A novel circuit employing a differential integrator having differential inputs $V_1$ and $V_2$ provides a substantially uniformly varying output voltage representative of a straight line for connecting two display points having voltage levels $V_1$ and $V_2$. This circuit is ideally used in the reconstruction of analog waveforms from digitally stored data for display on an oscilloscope.

8 Claims, 2 Drawing Figures

METHOD AND MEANS FOR POINT CONNECTING WITH A DIFFERENTIAL INTEGRATOR DOT CONNECTOR CIRCUIT

BACKGROUND OF THE INVENTION

A dot connector circuit is a circuit used to interconnect discrete points during the reconstruction of an analog waveform from digitally stored data. Such a circuit is necessary whenever digitally stored data are to be displayed, for example, on an oscilloscope. An analog waveform must be generated from the data to be used to drive the amplitude input, or Y-axis, of the oscilloscope. It is highly desirable that data points along the waveform be connected with straight lines of uniform intensity for this purpose.

In the prior art, dot connector circuits have been based on several different approaches. One of the most straight forward of these is to employ a digital-to-analog converter to drive the Y-axis of an oscilloscope directly. In this approach, staircase waveforms approximate diagonal lines. The accuracy of this approximation therefore depends upon the resolution of the digital-to-analog converter used; thus, the lower the resolution is, the coarser or larger the staircase steps will be. In practice with this approach then, there is the disadvantage of requiring a very high resolution converter in order to accurately and smoothly reconstruct the analog waveform.

A second method which has been used is to follow the digital-to-analog converter of the preceding method with a resistive-capacitive (RC) low pass filter. Inclusion of the low pass filter has the effect of smoothing the sharp edges of the staircase waveform. This approach, however, has the disadvantage of resulting in displays in which the data points are connected with exponential curves rather than straight lines.

Another approach in the prior art dot connector circuits uses two digital-to-analog converters. These converters are time-multiplexed; further, a triangle waveform is required to serve as the reference voltage inputs for these converters. Data points are fed alternately to one converter and then to the other. The outputs of the two converters are then summed, and the result of this summation is a waveform which forms a ramp from each data point to the next. Since the linearity of the ramps connecting data points depends on the piecewise linearity of the triangle waveform, this method then exhibits the disadvantage of requiring a perfect triangle waveform for good linearity. Furthermore, this method requires two converters rather than one as in some other methods.

Still another method of waveform regeneration is to follow a digital-to-analog converter with a summing amplifier. A second input to the summing amplifier is fed back from the overall output of the circuit. The output of this amplifier is a voltage proportional to the difference between the last data point and the next data point level. This difference is fed to a sample-and-hold amplifier, and then applied for a fixed time to the input of a standard integrator. The output of this integrator is buffered and then used to drive an oscilloscope. The result is a series of straight lines connecting the data points, but at the expense of a large number of parts and a very complex circuit. Timing of control signals for this approach is also a disadvantage: the timing is very critical.

SUMMARY OF THE INVENTION

The dot connector circuit in accordance with the preferred embodiment of the invention does not have any of the above enumerated disadvantages of the prior art circuits. The novel dot connector circuit makes use of a differential integrator directly following a digital-to-analog converter. A sampled and held version of the integrator output is fed back to its input. Thus the differential integrator is able to form a ramp linearly from each data point to the next. It is buffered and then used to drive an oscilloscope directly.

This new approach has many advantages over those in the prior art. For example, the circuit in accordance with the invention is simple, and its operation straightforward. There are very few parts in this circuit. Furthermore, a high resolution digital-to-analog converter is not required to generate a high quality analog waveform. The novel circuit also results in the data points being connected with straight lines of uniform intensity, and actual data points can be accented with dots on the oscilloscope by prolonging the display of these points. In short, the circuit in accordance with the preferred embodiment of the invention provides accurate reconstruction of analog waveforms from stored digital data in a simpler, and hence more dependable, manner than those in the prior art.

DETAILED DESCRIPTION OF THE PREFERRED EMBODIMENT

Before describing the preferred embodiment, a brief description of a differential integrator circuit is helpful. It is evident from FIG. 1 that:

$$\frac{V_1 - V_o}{R} = \frac{V_o - V_3}{R}, \text{ and } \frac{V_2 - V_o}{R} = \frac{V_o - V_3}{R} + I_o.$$

Isolating $V_3$ from each of these equations, and equating the resultant equations, the following relationship is established:

$$V_1 = V_2 - I_o R, \text{ or } I_o = \frac{V_2 - V_1}{R}.$$

Thus, the output current $I_o$ of the differential integrator is constant and is directly proportional to the difference of its input voltages. This output current is used to charge a capacitance C. The resultant output voltage $V_o$ across the capacitor C is then a substantially constantly varying voltage that can represent a straight line connecting two points having values of $V_1$ and $V_2$ volts, respectively. As can be seen from this brief description, the differential integrator is in essence a capacitance connected to a current source whose output is proportional to the difference of its voltage inputs.

Figure 1:
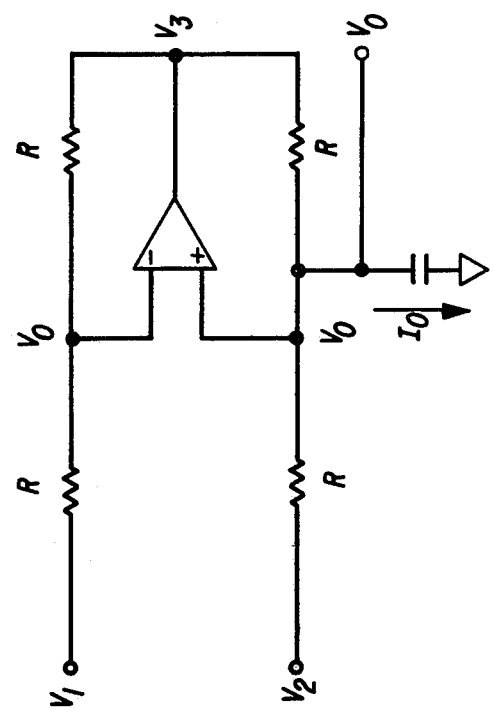
FIG. 1 shows a differential integrator.
Figure 2:
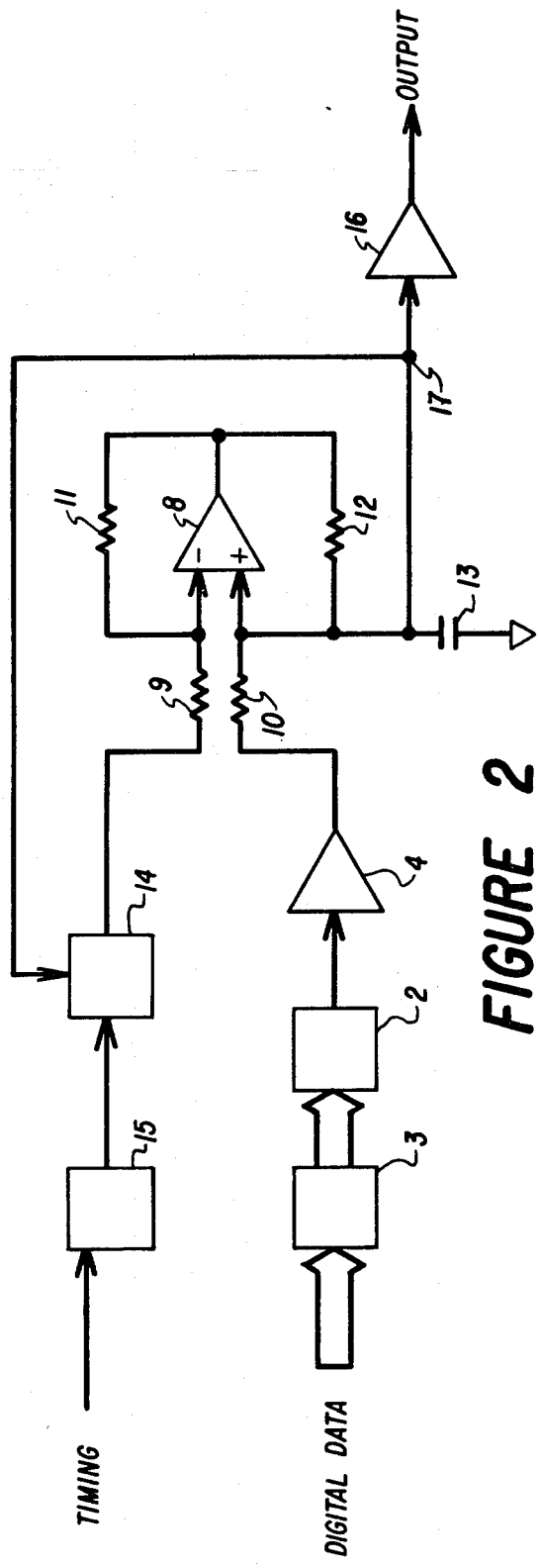
FIG. 2 shows a dot connector circuit in accordance with the preferred embodiment.

The dot connector circuit in accordance with the illustrated preferred embodiment incorporates a differential integrator circuit as shown in FIG. 1. This preferred embodiment is illustrated in FIG. 2. Therein, digital data are coupled to a digital-to-analog converter 2 through a data latch 3. In the illustrated preferred embodiment, an amplifier 4 converts the output current of the converter 2 to a voltage. In other embodiments, the converter and amplifier may be an integral component to provide an output voltage directly. This voltage is applied to one input port of a differential integrator 8 having input resistors 9, 10, feedback resistors 11, 12, and a charging capacitor 13. The output of the differential integrator 8, or a current source having a differential voltage input, is the voltage across the capacitor 13. This output is coupled to a sample-and-hold circuit 14. When in the sample mode, this circuit closes the feedback loop around the differential integrator 8, thus forcing the output voltage of the integrator 8 to be equal to the output voltage of the amplifier 4. In this mode the circuit output stays fixed at a level corresponding to the data input to the digital-to-analog converter 2. This level is held for a short time, for example, approximately 4 microseconds, thus resulting in an accentuated dot displayed on the screen of an oscilloscope (not shown) for each data point. At the end of this time, the sample-and-hold circuit 14 is switched to the hold mode, and new data corresponding to the next data point is applied to the converter 2. The inputs to the differential integrator 8 are now the voltage level of the previous data point $V_1$ coupled through input resistor 9 and the voltage level of the next data point $V_2$ coupled through input resistor 10. This results in a charging current through capacitor 13 which is proportional to the voltage difference between the last and next data point levels, $V_1$ and $V_2$ respectively. Because this charging current is substantially constant, the resultant voltage at a circuit output port 17 connected thereto is a substantially uniformly varying voltage spanning the last and next data point levels $V_1$ and $V_2$. In other words, on the oscilloscope this results in a straight line connecting the two data points. An adjustable hold time is available to prolong the display of the end data points for accentuation. This hold time, in the present example, is generated by a single-shot multivibrator 15. At the end of this hold time, the sample-and-hold circuit 14 is switched back to the sample mode, the feedback loop around the differential integrator 8 is once again closed, and the circuit output 17 settles to a voltage level corresponding to the next data point; and the next data point is created on the oscilloscope screen. A buffer 16 can be added at the circuit output 17 to aid in driving the oscilloscope.

I claim:

1. An apparatus to display two points having voltage levels $V_1$ and $V_2$ interconnected by a substantially uniformly varying voltage representative of a straight line, comprising:

current source means for providing an output current directly proportional to the difference of its input voltages, said current source means having first and second input ports for accepting said $V_1$ and $V_2$ volts, respectively;

capacitance means coupled to said first current source means for providing in response to said output current said substantially uniformly varying voltage; and a video display having an amplitude input port coupled to said substantially uniformly varying voltage.

2. An apparatus to connect two display points having voltage levels $V_1$ and $V_2$ with a substantially uniformly varying voltage representative of a straight line, comprising:

current source means for providing an output current directly proportional to the difference of its input voltages, said current source means having first and second input ports for accepting said $V_1$ and $V_2$ volts, respectively;

capacitance means coupled to said current source means for providing in response to said output current said substantially uniformly varying voltage;

a sample-and-hold circuit having its input port coupled to said capacitance means and its output port coupled to said current source means for sampling a voltage level at said capacitance means and for providing said sampled voltage as said $V_1$ to said first input port; and input amplifier means coupled to said second input port for providing said $V_2$ to said current source means.

3. The apparatus as in claim 2 wherein said input amplifier means comprises a digital-to-analog converter means for converting digital data into a voltage output $V_2$.

4. The apparatus as in claim 2 or 3 further comprising a buffer amplifier coupled to said capacitance means for coupling externally said substantially uniformly varying voltage having $V_1$ and $V_2$ as end points.

5. A method for displaying two points having voltage levels $V_1$ and $V_2$ interconnected by a substantially uniformly varying voltage representative of a straight line, comprising the steps of:

applying said $V_1$ to a first input port of a current source means for providing an output current directly proportional to the difference of its input voltages;

applying said $V_2$ to a second input port of said current source means;

charging with said output current a capacitance means for providing in response to said output current said substantially uniformly varying voltage; and applying said substantially uniformly varying voltage to the amplitude input port of a video display.

6. A method for connecting two display points having voltage levels $V_1$ and $V_2$ with a substantially uniformly varying voltage representative of a straight line, comprising the steps of:

applying said $V_1$ to a first input port of a current source means for providing an output current directly proportional to the difference of its input voltages;

applying said $V_2$ to a second input port of said current source means;

charging with said output current a capacitance means for providing in response to said output current said substantially uniformly varying voltage;

sampling said capacitance means at a select voltage level;

coupling said sampled voltage to said first input port, said sampled voltage being said $V_1$;

amplifying an applied input; and coupling said amplified applied input to said second input port, said amplified input being said $V_2$.

7. The method as in claim 6 wherein said step of amplifying comprises converting an applied digital input to an analog voltage and amplifying same.

8. The method as in claim 6 or 7 further comprising the step of amplifying said substantially uniformly varying voltage to provide a buffered output signal.

* * * * *